(12) United States Patent
Berger

(10) Patent No.: US 7,904,431 B1
(45) Date of Patent: Mar. 8, 2011

(54) METHOD AND SYSTEM FOR AUTOMATED REQUEST MODELLING

(75) Inventor: Jiri Berger, Veltrusy (CZ)

(73) Assignee: Craft. Case Ltd., London (GB)

( * ) Notice: Subject to any disclaimer, the term of this patent is extended or adjusted under 35 U.S.C. 154(b) by 404 days.

(21) Appl. No.: 12/029,206

(22) Filed: Feb. 11, 2008

(51) Int. Cl.
*G06F 7/00* (2006.01)
*G06F 17/00* (2006.01)

(52) U.S. Cl. .................. 707/690; 707/694; 707/790

(58) Field of Classification Search .......... 707/687–674, 707/790–811, 999.1–999.103, 690, 694
See application file for complete search history.

(56) References Cited

U.S. PATENT DOCUMENTS

| | | | |
|---|---|---|---|
| 5,241,645 | A | 8/1993 | Cimral et al. |
| 5,819,270 | A | 10/1998 | Malone et al. |
| 6,016,497 | A | 1/2000 | Suver |
| 6,035,300 | A * | 3/2000 | Cason et al. ........... 707/999.102 |
| 6,341,279 | B1 | 1/2002 | Nye |
| 6,877,153 | B2 | 4/2005 | Konnersman |
| 7,155,700 | B1 | 12/2006 | Sadhu et al. |
| 2002/0091705 | A1* | 7/2002 | Mitomi et al. ............ 707/103 R |
| 2005/0149474 | A1* | 7/2005 | Kalthoff et al. ................... 707/1 |
| 2006/0047618 | A1* | 3/2006 | Bannach .......................... 707/1 |
| 2006/0047665 | A1* | 3/2006 | Neil ................................ 707/10 |
| 2006/0218192 | A1* | 9/2006 | Gopalakrishnan ......... 707/104.1 |
| 2006/0265415 | A1 | 11/2006 | Abrams et al. |

OTHER PUBLICATIONS

Engels et al., "Model-Based Verification and Validation of Properties", Electronic Notes in Theoretical Computer Science, 2003, pp. 1-18. download: http://www.sciencedirect.com.*
Sargent, Robert, "Verification and validation of simulation models", IEEE, 2007. p. 137-137. Download: http://ieeexplore.ieee.org/stamp/stamp.jsp?arnumber=4419595.*
Voitech Merunka, User Guide of modelling tool Craft.CASE 1.1, e-FRACTAL Ltd., Mar. 30, 2005.
Freddy Allilaire et al., ATL: EClipse Support for Model transformation, Univ. of Nantes, 2 rue de la Houssiniere BP 92208 44322, Nantes, France [need dated copy]].
Meta Object Facility (MOF) Core Specification, V2, Jan. 2006.

* cited by examiner

*Primary Examiner* — John E Breene
*Assistant Examiner* — Hares Jami
(74) *Attorney, Agent, or Firm* — Burns & Levinson LLP; Orlando Lopez

(57) ABSTRACT

A method and a system for automated request modelling from a plurality of inputs, imports, interactive sessions, and requirements are provided that rely on various interfaces to both receive the user and other input data and store it. In one instance, the system and models can compares, test, simulate, sort, and analyse incoming data and the processes built with those data, and can execute request models by simulation.

9 Claims, 12 Drawing Sheets

METHOD AND SYSTEM FOR AUTOMATED REQUEST MODELLING

BACKGROUND

The system and method of the present embodiment relate generally to automated request modelling from plurality of inputs, imports, exports, and outputs using automated data storage.

Computers can be effective tools for modelling many types of systems, both physical and organisational. One type of modelling tool is an object-oriented modelling system, which establishes computer-based environments that include object types and relationship types. One such object-oriented modelling environment is known as request modelling.

A request modelling environment can enable the building of models of business processes, such as enterprises for which enterprise architecture models may be developed. Request modelling can address the need to understand increasingly complex enterprises, enabling decision makers and those that carry out the everyday work to share a common understanding, represented as a visual model. The request model can form a basis for making informed decisions, since, with the request model, it can be possible to reveal the complex interplay within the enterprise.

An enterprise architecture model can enable illustration and depiction of enterprises and their ongoing processes, their customers, and their suppliers. A request modelling environment for an enterprise can provide an illustrative domain for depicting how the interactions among processes, hierarchies, activities, and relationships within an enterprise can arise. A desired request modelling system does not restrict the user to a particular visual representation for models, but can provide templates for the modelling of different domains. A desired method and system for request modelling can permit the author to directly input into the model, or import data from other applications, and to analyse models and access data outside of the model.

An enterprise model can assist in determining the total impact of a requested initiative on an enterprise. It can provide the structure and repeatable processes to obtain facts and data for management to make informed decisions that support the vision of the enterprise. The enterprise model may include components such as enterprise operations framework, an investment strategy, an integration roadmap, and governance. The enterprise model can model an enterprise system, which can be any integrated solution for linking business processes, data, and applications across functions, geographies and business units within an enterprise. The enterprise operations framework can provide a complete view of how an organisation operates today and in the future to achieve its vision. It is the foundation for the overall systems design and operation, and represents how an organisation will operate, verifies the system's current operational state, and indicates where and how current initiatives are changing the system's base.

One aspect of a request modelling environment program is that not only can it provide the ability to model enterprises according to different needs, but it can also provide the ability to create entirely new elements of metamodel and request model depending on needs. This capability can permit a request model to be developed using request modelling software that can expand to new processes, hierarchies, activities, and new relationships and new features within these relationships, that previously may not have existed.

New request models can be created using a graphical user interface, and spreadsheets can be used to gather requirements, perform logical design, or review and revise existing request models in a test setting, in particular, to iteratively change an existing model, in the event that a business process changes. Request model files can be created from the spreadsheet, and classes and relationship types can be created from the request model files, and used in the actual request model. To transition from the spreadsheet to the request model files, possibly over a thousand relationships can arise that need to be consistent.

The field of enterprise architecture is one in which the strengths of an automated request modelling system can be clearly seen. In order to optimise the use of information technology by complex, often global organisations, enterprise architects can use such a tool to not only represent complexity, but also to aid in analysis. This can allow them to produce output that is intelligible to many different user groups.

SUMMARY

In one embodiment of the present teachings, a method and system for automated request modelling from a plurality of inputs, imports, interactive sessions, and requirements is provided that relies on various interfaces to both receive the user and other input data and store it. Such storage can include an instance storage model and a metadata storage model. An output can include, for example, Unified Modeling Language formatted information. The various interfaces are real time, and the present embodiment provides for on-line context and consistency dependence. User interaction can be checked for consistency within a context using a data storage system and method. Testing and simulation are possible to assure the model's quality.

A technical advantage, among others, of the present invention can be an increase in productivity and reduction in delivery cycle time for the modelled application. Using one embodiment, the present teachings can reduce errors in the development of request model system input. Another embodiment, moreover, compares, tests, simulates, sorts, and analyses incoming data and the processes built with those data, and can execute request models by simulation.

Other technical advantages can include that the embodiments of the system and method of the present teachings allow both graphical and textual means to gather requirements and review request models. Using the request model simulation and generation process and system of the present teachings, request model specification spreadsheets, for example, can be processed automatically, possibly in a batch mode, without requiring re-entry of specifications.

The present teachings can allow the user to specify request model requirements, and can also enable review of request model object types, hierarchies, and relationship types as a set. The present teachings can also provide automated assistance in checking consistency with respect to, among other things, context.

For a better understanding of the present teachings, reference is made to the accompanying drawings and detailed description.

DETAILED DESCRIPTION OF THE DISCLOSURE

Embodiments of the system of these teachings are now described more fully hereinafter with reference to the accompanying drawings, in which the illustrative embodiment of the present disclosure is shown. The following configuration description is presented for illustrative purposes only. Any computer configuration satisfying the speed and interface requirements herein described may be suitable for implementing the system of the present disclosure.

The system and method of the present teachings provide a place to store data, and insure that the stored data are consistent. Operationally, for example, an analyst can receive features of a system from the system designer, and then describe the functions required by the features, and scenarios that can happen to achieve the features. Participants and dataflows can be described. A participant is an object which participates in the processes in the system. A participant can be, for example, a human, a machine, or an information system. A scenario is a detailed description of a process. Each scenario can be derived from another scenario. Participants can be a part of scenarios. Participants can play different roles in the modeling process. Roles can include, for example, approves, consults, cooperates, default, is informed, is responsible, and performs. Dataflows are objects that exchange other objects during mutual communications. They are, for example, information, financial or material flows.

Figure 1:
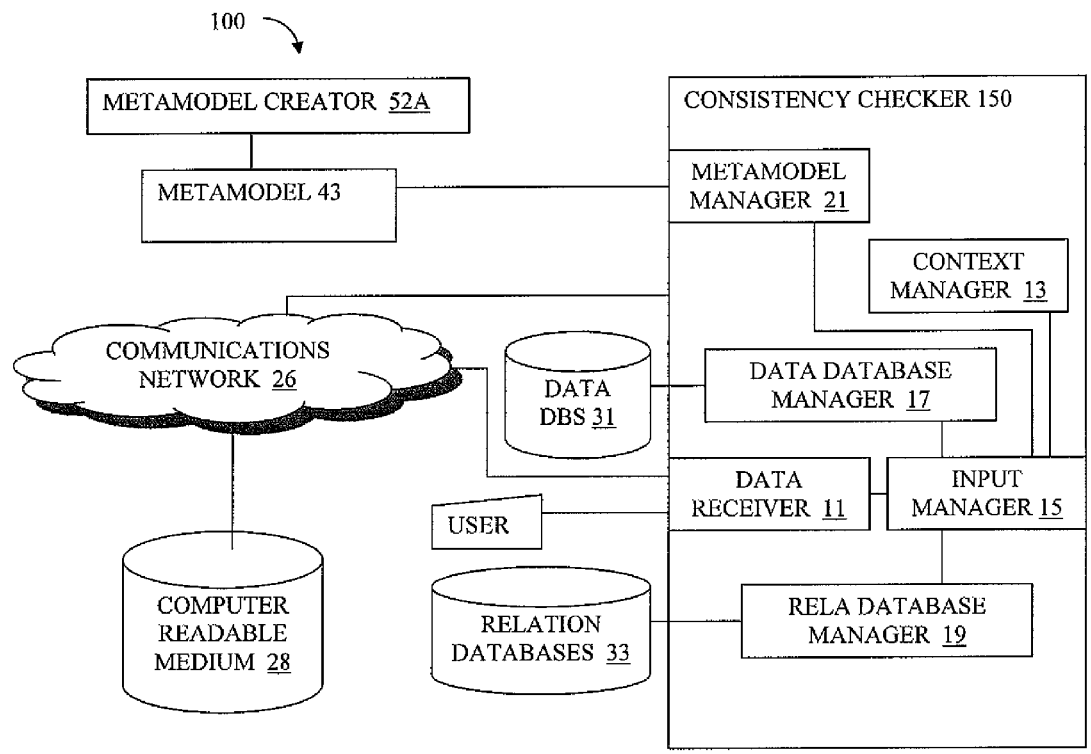
FIG. 1 is a schematic block diagram of the components of an embodiment described herein.

Referring now primarily to FIG. 1, in one embodiment, system 100 can include, but is not limited to including, metamodel creator 52A for creating metamodel 43, consistency checker system 150 for maintaining the consistency within context 25 (FIG. 2) of metamodel 43, communications network 26 for providing communications, if required, among components of system 100, and computer readable medium 28 for providing data and program storage for components of system 100. Consistency checker system 150 can include, but is not limited to including metamodel manager 21, context manager 13, data database manager 17, data receiver 11, input manager 15, and relationship database manager 19. Each of these components is discussed in further detail in the following paragraphs.

Figure 2:
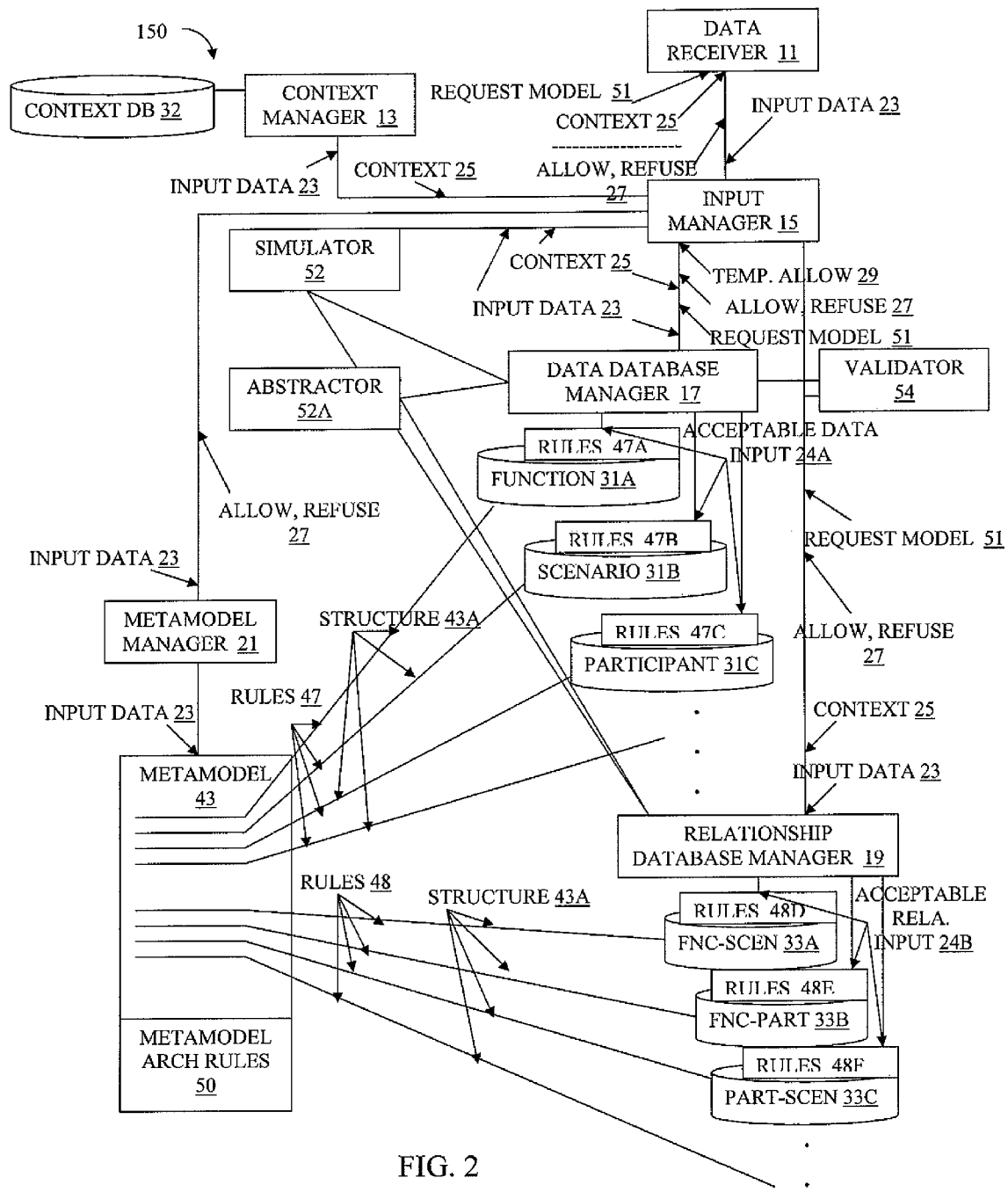
FIG. 2 is a schematic block diagram of the components of an embodiment of a consistency checker system.

Referring now to FIG. 2, in one embodiment, consistency checker system 150 for consistency checking of automated request modelling request data and metamodel data can include, but is not limited to including, data receiver 11 receiving input data 23, and input manager 15 sorting input data 23 into categories including data 31, relationship 33, and metamodel 43. Metamodel architecture rules 50 can be based on, for example, a state machine, but could be based on any similar logical or AI paradigm. Metamodel 43 is an instance of a metametamodel, the backbone for generating metamodel 43, that has only one term—element, where element can connect to other elements. There are restrictions on connections described by preselected rules. Element may be modified by changing its connections to other elements. Metamodel 43 is formulated by instantiating the metametamodel. Metamodel 43 includes elements, element attributes, and connections between elements. Metamodel 43 can include structure 43A and rules 47, 48 to establish databases, for example function 31A and function-scenario relationship 33A. Input into metamodel 43 involves modifying an element either by modifying its element attributes or by modifying its connections to other elements. When a modification happens, consistency checker system 150 performs both a consistency check and a context check. During the consistency check, consistency checker system 150 checks that only such elements that can be connected are connected according to preselected rules in the metamodel. During the context check, even though some elements could be allowed to be connected, the connections don't make sense in certain contexts. An element's context is determined by its connections, transitively. For example, "security" for a person, and "security" for money transfer are two different elements which share a connection to the string "security". They have totally disjoint connections to different contexts. Instance storage and meta storage models are created when metamodel 43 is modified. These models can be navigated in order to check contexts and consistency against preselected requirements. Further, the instance storage model can be navigated in order to simulate activity. Connections are checked for consistency and context as soon after the connections are made as possible. Consistency checker system 150 can also include context manager 13 checking context 25 for input data 23, creating context 25 if necessary, and storing input data 23 in context 25. Consistency checker system 150 can even further include data database manager 17 matching input data 23 with data database 31, consistency checking input data 23 against data rules 47 associated with data database 31 to determine if input data 23 that matches data database 31 are acceptable, modifying data database 31, and storing input data 23 in data database 31 if input data 23 are acceptable. Data database manager 17 can also initiate rule modification when input data 23 are rules 47, 48. In particular, when rules are modified, existing parts of request model 51 or metamodel 43 might require modification. Consistency checker system 150 can still further include relationship database manager 19 matching input data 23 with relationship database 33, consistency checking input data 23 against relationship rules 48 associated with relationship database 33 to determine if input data 23 that matches relationship database 33 are acceptable, modifying relationship database 33, and storing input data 23 in relationship database 33 if input data 23 are acceptable. Consistency checker system 150 can also include metamodel manager 21 creating metamodel 43 and updating metamodel 43 with input data 23 if input data are metamodel data. In this embodiment, input manager 15 can routes input data 23 to one of context manager 13, data database manager 17, relationship database manager 19, or metamodel manager 21, depending upon input data 23. Consistency checker system 150 can include simulator 52, which could be utilized to validate the request model. Simulator 52 can verify and validate request model 51. Simulator 52 can navigate request model 51 by accessing data data databases 31 and relationship databases 33 and providing a current position, i.e. current context 25, to the user. Request model 51 can include conditions such as, for example, questions, exceptions, synchronization points, and forks, that can guide simulator 52 during its navigation. These conditions can require user input during the operation of simulator 52, or simulator 52 can base its navigation on data derived from data databases 31 and relationship databases 33 according to rules in metamodel 43 associated with request model 51. For example, for a particular context 25, simulator 52 would execute a set of steps, depending on associated data from data databases 31, for example, or depending on previous steps taken, for another example. Abstractor 52A can transform request model 51 into another request model with the same functionality. Abstractor 52A can be initiated either automatically or manually. If initiated automatically, abstractor 52A can monitor data databases 31 and relationship databases 33 to detect patterns that can be transformed by abstractor 52A. If abstractor 52A detects a pattern that can be transformed, abstractor 52A proposes a possible transformation and determines by, for example, requesting user input, if the transformation is to be performed. Abstractor 52A can perform the transformation by directly deleting data from and inserting data into data databases 31 and relationship databases 33. Abstractor 52A determines possible transformations from metamodel 43.

Continuing to refer to FIG. 2, data rules 47 and relationship rules 48, which original in metamodel 43, serve to validate input data 23. For example, one of relationship rules 48 could require a prohibition on transitioning from a state to an activity for elements belonging to distinct participants as found in participant database 31C. Consistency checker system 150 could allow a temporary relaxation of the rule, without which, only an empty diagram and perfectly complete diagram would be valid. To gradually draw a diagram, the rules can be relaxed. Consistency checker system 150 can check input data 23 and can signal a broken "critical" rule, for example by highlighting an activity->state transition arrow. Consistency checker system 150 can include validator 54 for determining subtle problems in the request model. Validation checking can follow the same procedure as entering input data 23, i.e. checking against data rules 47 and relationship rules 48.

Figure 3:
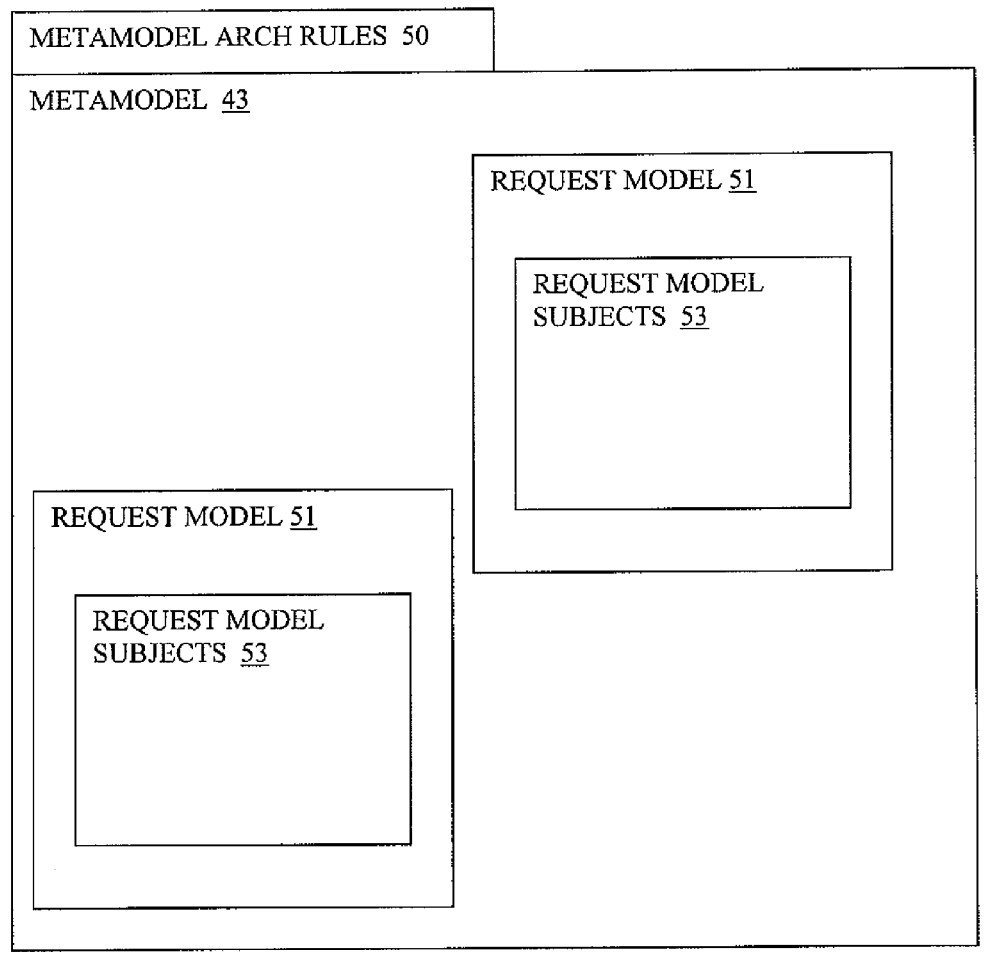
FIG. 3 is a schematic block diagram of the models created and acted upon by the described embodiments.

Referring now primarily to FIG. 3, the relationship between metamodel 43, request model 51, and request model subjects 53 is shown. Request model subjects 53 can include, but are not limited to including, instances, request model classes, request model rules, and request model relationships. Metamodel architecture rules 50 guide which input data 23 (FIG. 2) can be acceptable to modify metamodel 43.

Figure 4A:
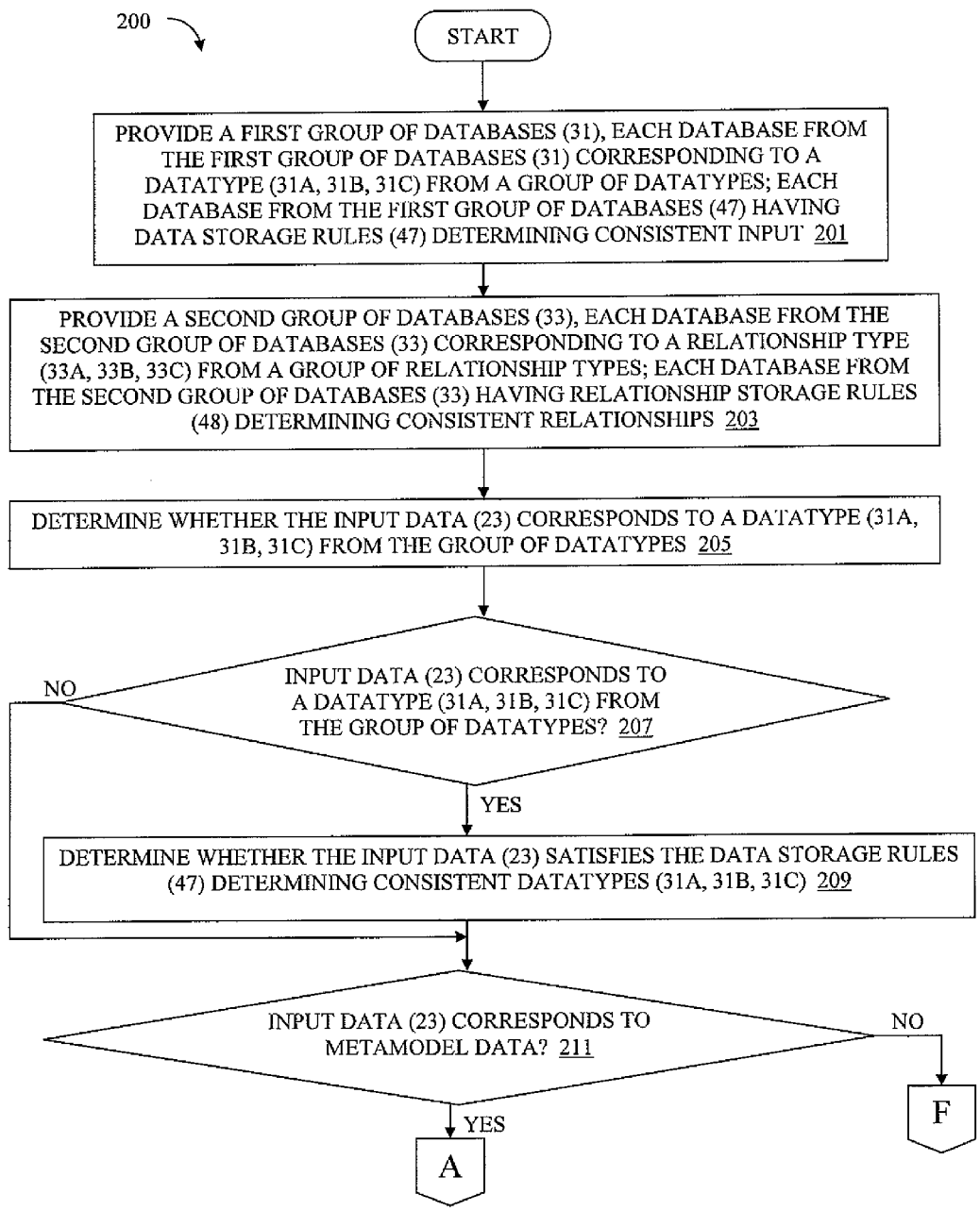
FIGS. 4A and 4B depict a flowchart of the method of an embodiment described herein.
Figure 4B:
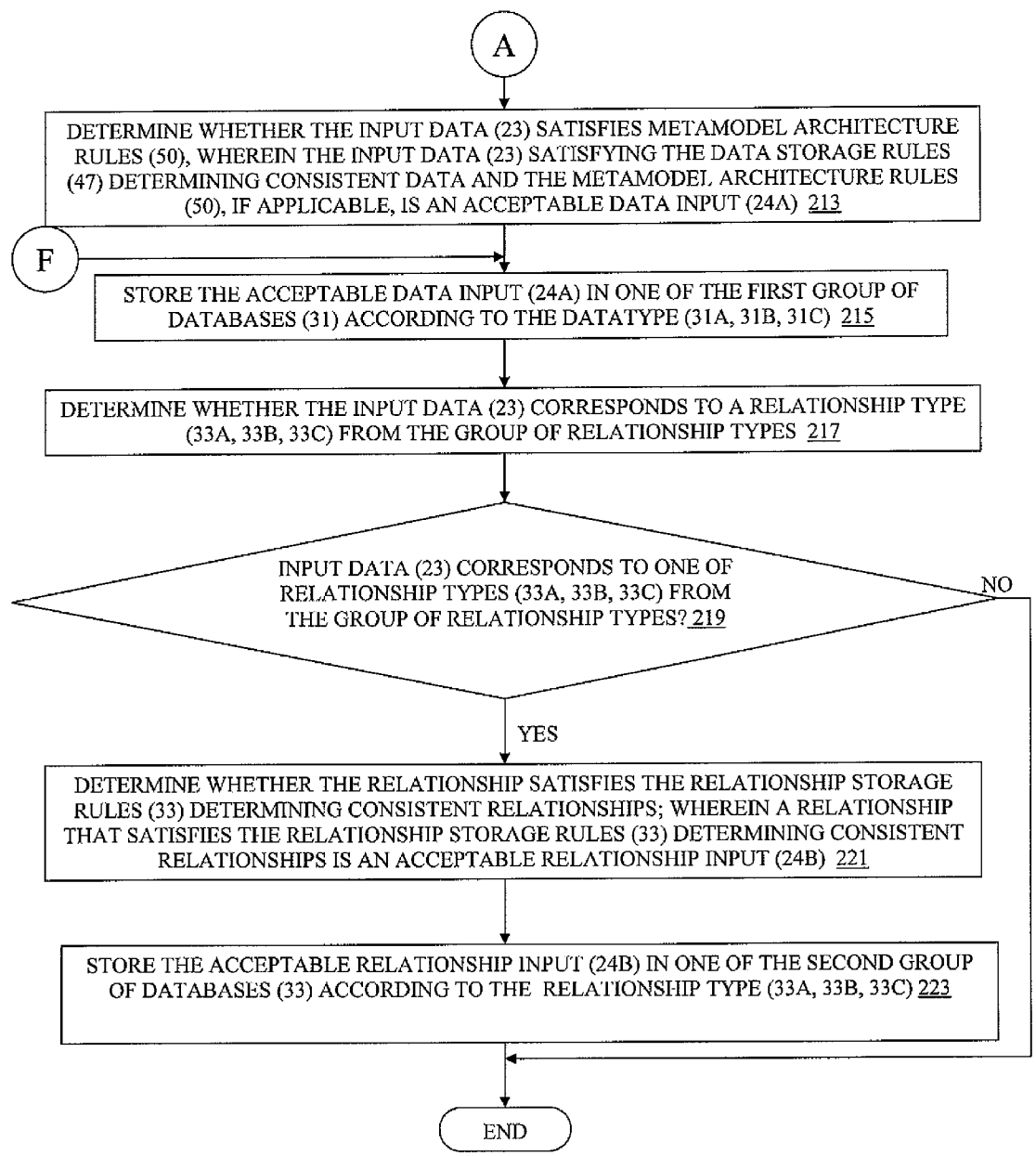
Figure 8A:
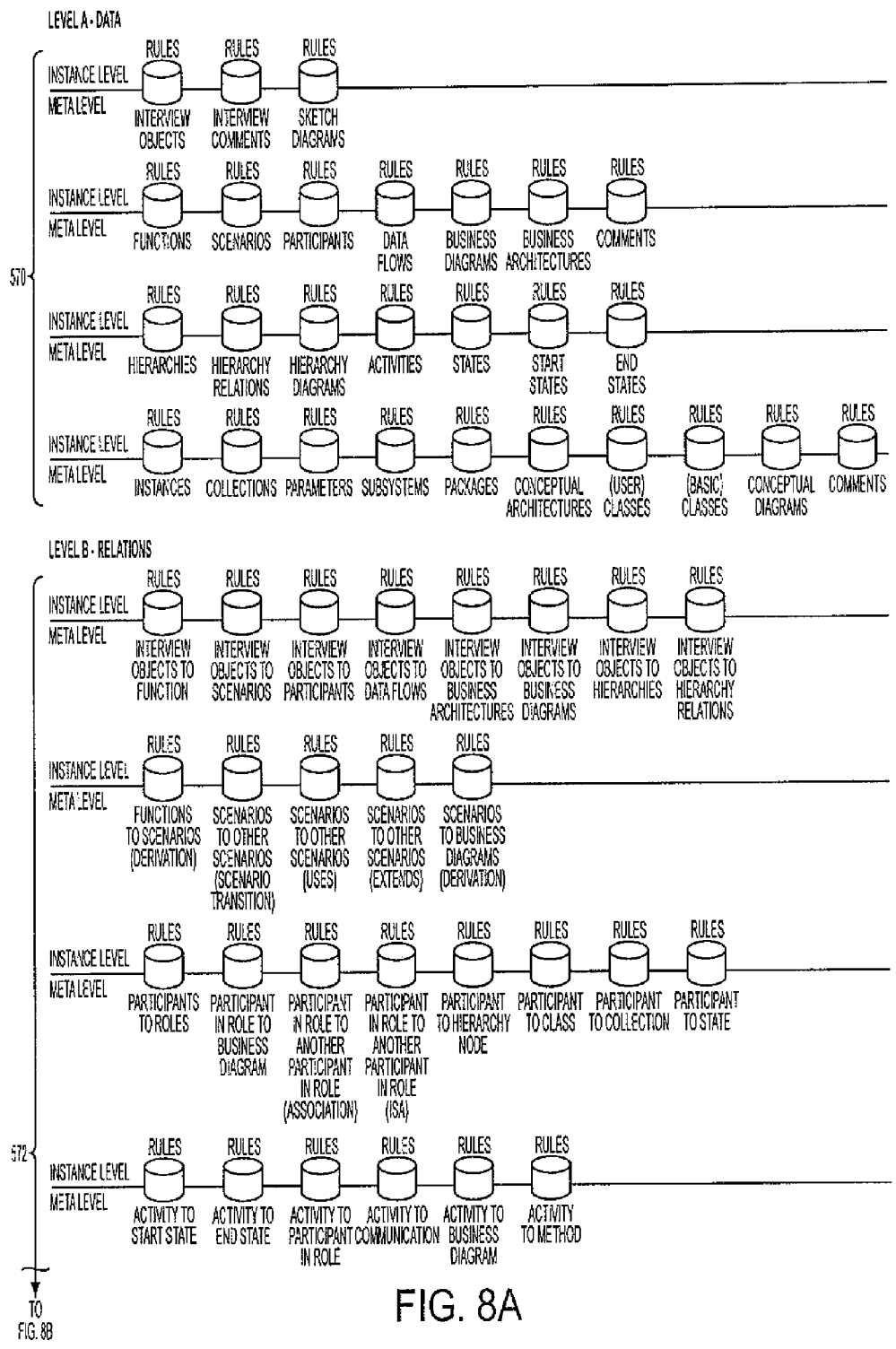
FIGS. 8A and 8B are database hierarchy diagrams.
Figure 8B:
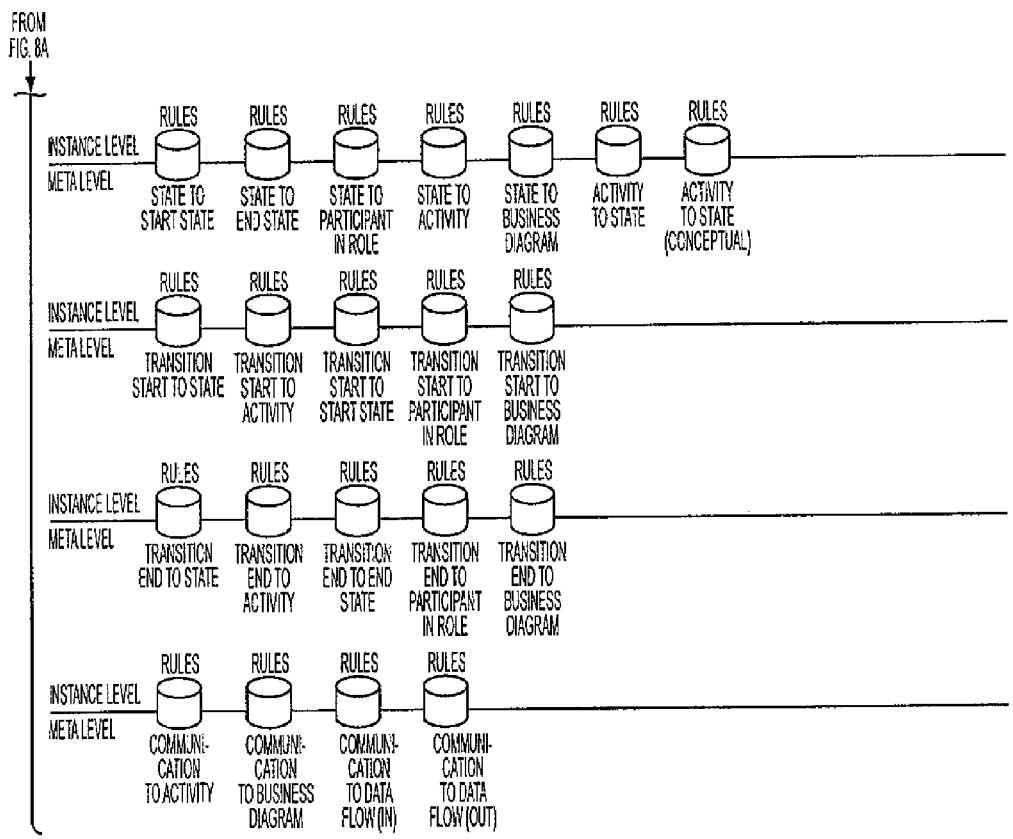

Referring now to FIGS. 2, 4A and 4B, in one embodiment, method 200 (FIGS. 4A, 4B) for verifying consistency of input data 23 (FIG. 2) corresponding to a request model 51 (FIG. 2) or a metamodel 43 (FIG. 2) can include, but is not limited to including, the step of providing 201 (FIG. 4A) first group of databases 31 (FIG. 2), each database from first group of databases 31 (FIG. 2) corresponding to datatype 31A, 31B, 31C etc. (FIG. 2) from a group of datatypes; each database from first group of databases 31 (FIG. 2) having data storage rules 47 (FIG. 2) determining consistent input. Method 200 (FIGS. 4A, 4B) can also include the step of providing 203 (FIG. 4A) second group of databases 33 (FIG. 2), each database from second group of databases 33 (FIG. 2) corresponding to relationship type 33A, 33B, 33C etc. (FIG. 2) from a group of relationship types, each database from second group of databases 33 (FIG. 2) having relationship storage rules 48 (FIG. 2) determining consistent relationships. Note that datatypes 31A, 31B, 31C etc. and relationship types 33A, 33B, 33C etc. depicted in FIG. 2 are exemplary. The embodiment is capable of including many other datatypes and relationship types, for example, those shown in FIGS. 8A and 8B. Method 200 (FIGS. 4A, 4B) can further include the steps of determining 205 (FIG. 4A) whether input data 23 (FIG. 2) corresponds to datatype 31A, 31B, 31C etc. (FIG. 2) from the group of datatypes, and, if 207 (FIG. 4A) input data 23 (FIG. 2) corresponds to datatype 31A, 31B, 31C etc. (FIG. 2) from the group of datatypes, determining 209 (FIG. 4A) whether input data 23 (FIG. 2) satisfies data storage rules 47 (FIG. 2) determining consistent datatypes 31A, 31B, 31C etc. (FIG. 2). Method 200 (FIGS. 4A, 4B) can still further include the step of, if 211 (FIG. 4A) input data 23 (FIG. 2) corresponds to request model 51, determining 213 (FIG. 4B) whether input data 23 (FIG. 2) satisfies metamodel architecture rules 50 (FIG. 2). Input data 23 (FIG. 2) that satisfy data storage rules 47 (FIG. 2) and the metamodel architecture rules 50 (FIG. 2), if applicable, are acceptable data input 24A (FIG. 2). Method 200 (FIGS. 4A, 4B) can still further include the steps of storing 215 (FIG. 4B) acceptable data input 24A (FIG. 2) in one of first group of databases 31 (FIG. 2) according to datatype 31A, 31B, 31C etc. (FIG. 2), determining 217 (FIG. 4B) whether input data 23 (FIG. 2) corresponds to one of the relationship types 33A, 33B, 33C etc. (FIG. 2) from the group of relationship types, and, if 219 (FIG. 4B) input data 23 (FIG. 2) corresponds to relationship type 33A, 33B, 33C etc. (FIG. 2) from the group of relationship types, determining 221 (FIG. 4B) whether the relationship satisfies relationship storage rules 48 (FIG. 2) determining consistent relationships. A relationship that satisfies relationship storage rules 48 (FIG. 2) is an acceptable relationship input 24B (FIG. 2). Method 200 (FIGS. 4A, 4B) can still further include the step of storing 223 (FIG. 4B) acceptable relationship input 24B (FIG. 2) in one of second group of databases 33 (FIG. 2) according to relationship type 33A, 33B, 33C etc. (FIG. 2).

Referring again primarily to FIG. 2, method 200 (FIGS. 4A, 4B) can optionally include the steps of associating input data 23 with context 25, and limiting acceptable data input 24A or acceptable relationship input 24B according to context 25. Method 200 (FIGS. 4A, 4B) can further optionally include the steps of, if input data 23 are data attributes associated with stored data, updating first group of databases 31 with input data 23 associated with stored data, and, if input data 23 are relationship attributes associated with stored relationships, updating second group of databases 33 with input data 23 associated with the stored relationships. Method 200 (FIGS. 4A, 4B) can still further optionally include the steps of, if input data 23 are new datatypes, adding the new datatypes to the first group of databases 31, if input data 23 are new relationship types, adding the new relationship types to second group of databases 33, and updating metamodel 43.

Referring now to FIGS. 2, 4A, 4B, and 4C, in another embodiment, method 300 (FIGS. 5A-5C) for consistency checking of automated request modelling request and metamodel data can include, but is not limited to including, the steps of (a) receiving 301 (FIG. 5A) input data 23 (FIG. 2), (b) if 303 (FIG. 5A) context 25 (FIG. 2) is not already created, creating context 25 (FIG. 2), storing input data 23 (FIG. 2) in context 25 (FIG. 2), and storing context 25 (FIG. 2) in a context database 32 (FIG. 2), (c) if 305 (FIG. 5A) the context database 32 (FIG. 2) is created, and context 25 (FIG. 2) is not already retrieved, retrieving at least one of contexts 25 (FIG. 2) from context database 32 (FIG. 2) according to input data 23 (FIG. 2), and (d) if 307 (FIG. 5A) one of a set of data databases 31 (FIG. 2) matches input data 23 (FIG. 2), if 309 (FIG. 5A) input data 23 (FIG. 2) are related to the retrieved context, and if 311 (FIG. 5A) input data 23 (FIG. 2) satisfies a set of data rules 47 (FIG. 2) associated with the matching data database, allowing 313 (FIG. 5B) input data 23 (FIG. 2) and sending allow/refuse notification 27 (FIG. 2). Method 300 (FIGS. 5A-5C) can also include the step of (e) if 315 (FIG. 5B) input data 23 (FIG. 2) modify the matching data database, if 317 (FIG. 5B) input data 23 (FIG. 2) are allowed, determining 319 (FIG. 5B) an optimal location to store input data 23 (FIG. 2) in the matching data database according to a preselected rule from the set of data rules 47 (FIG. 2) associated with the matching data database, and storing 321 (FIG.

5B) input data 23 (FIG. 2) in the matching data database in the optimal location. Method 300 (FIGS. 5A-5C) can still further include the step of (f) if 323 (FIG. 5B) one of a set of relationship databases matches input data 23 (FIG. 2), if 325 (FIG. 5B) input data 23 (FIG. 2) is related to the retrieved context 25 (FIG. 2), and if 327 (FIG. 4C) input data 23 (FIG. 2) satisfies a set of relationship rules 48 (FIG. 2) associated with the matching relationship database, allowing 329 (FIG. 4C) input data 23 (FIG. 2). Method 300 (FIGS. 5A-5C) can also include the steps of (g) if 331 (FIG. 4C) input data 23 (FIG. 2) modifies the matching relationship database, and if 333 (FIG. 4C) input data 23 (FIG. 2) are allowed, determining 335 (FIG. 4C) the optimal location to store input data 23 (FIG. 2) in the matching relationship database according to another preselected rule from the set of relationship rules 48 (FIG. 2) associated with the matching relationship database, and storing 337 (FIG. 4C) input data 23 (FIG. 2) in the matching relationship database in the optimal location, and (h) if 339 (FIG. 4C) input data 23 (FIG. 2) are datatypes 31A, 31B, 31C etc. (FIG. 2) or relationship types 33A, 33B, 33C etc. (FIG. 2), updating 341 (FIG. 4C) the metamodel 43 (FIG. 2) with input data 23 (FIG. 2).

Figure 5A:
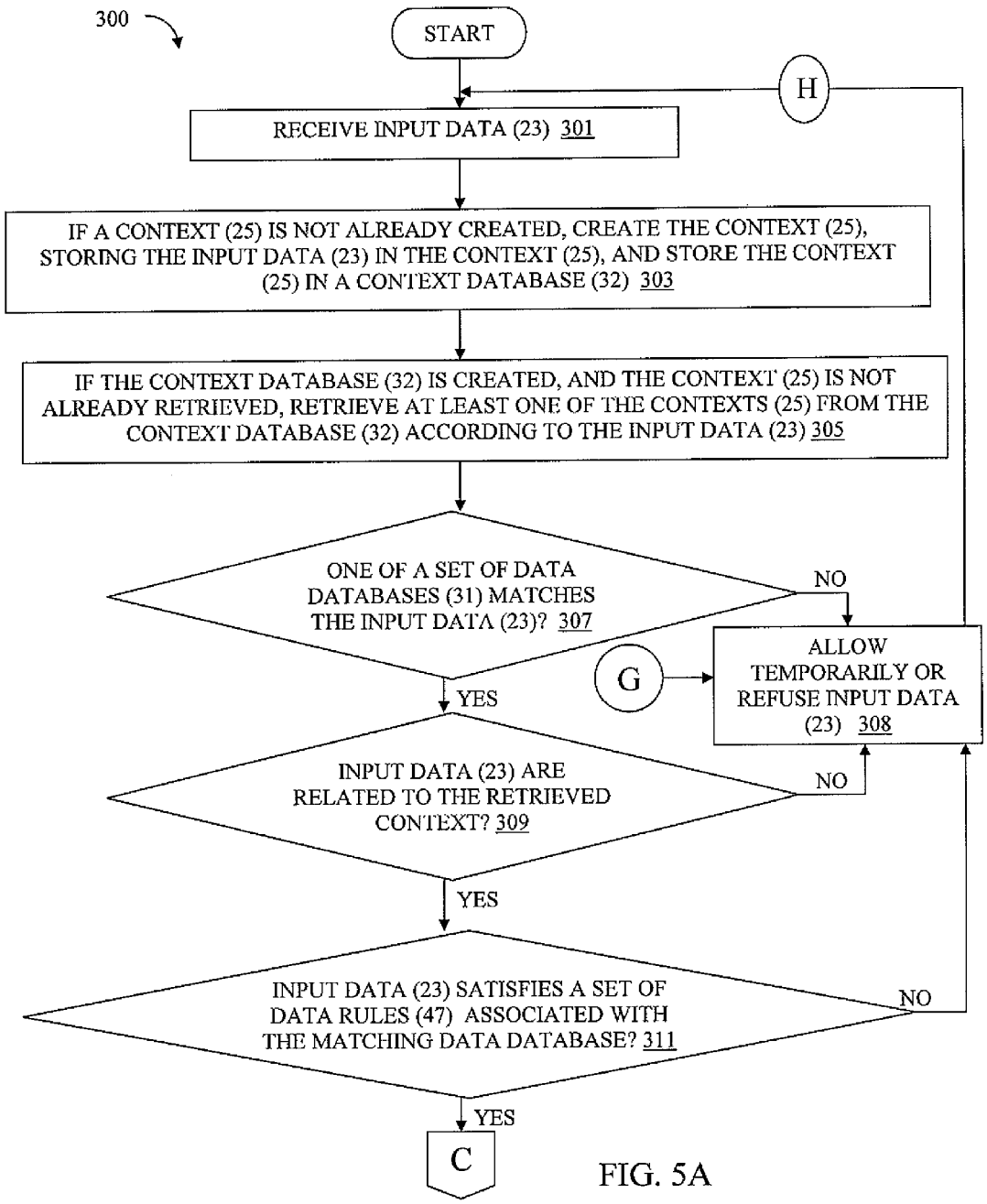
FIGS. 5A, 5B, and 5C depict a flowchart of an alternate embodiment described herein.
Figure 5B:
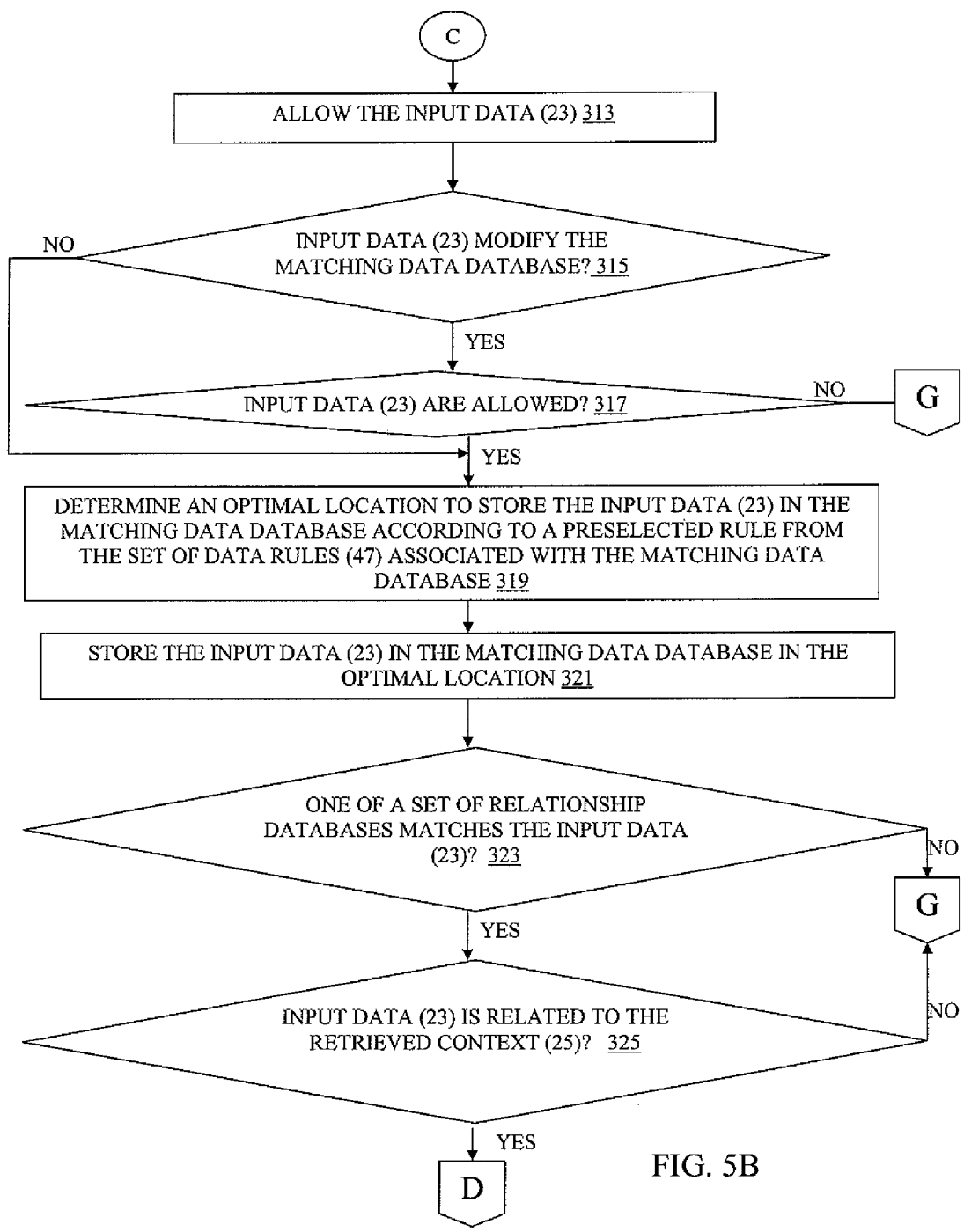
Figure 5C:
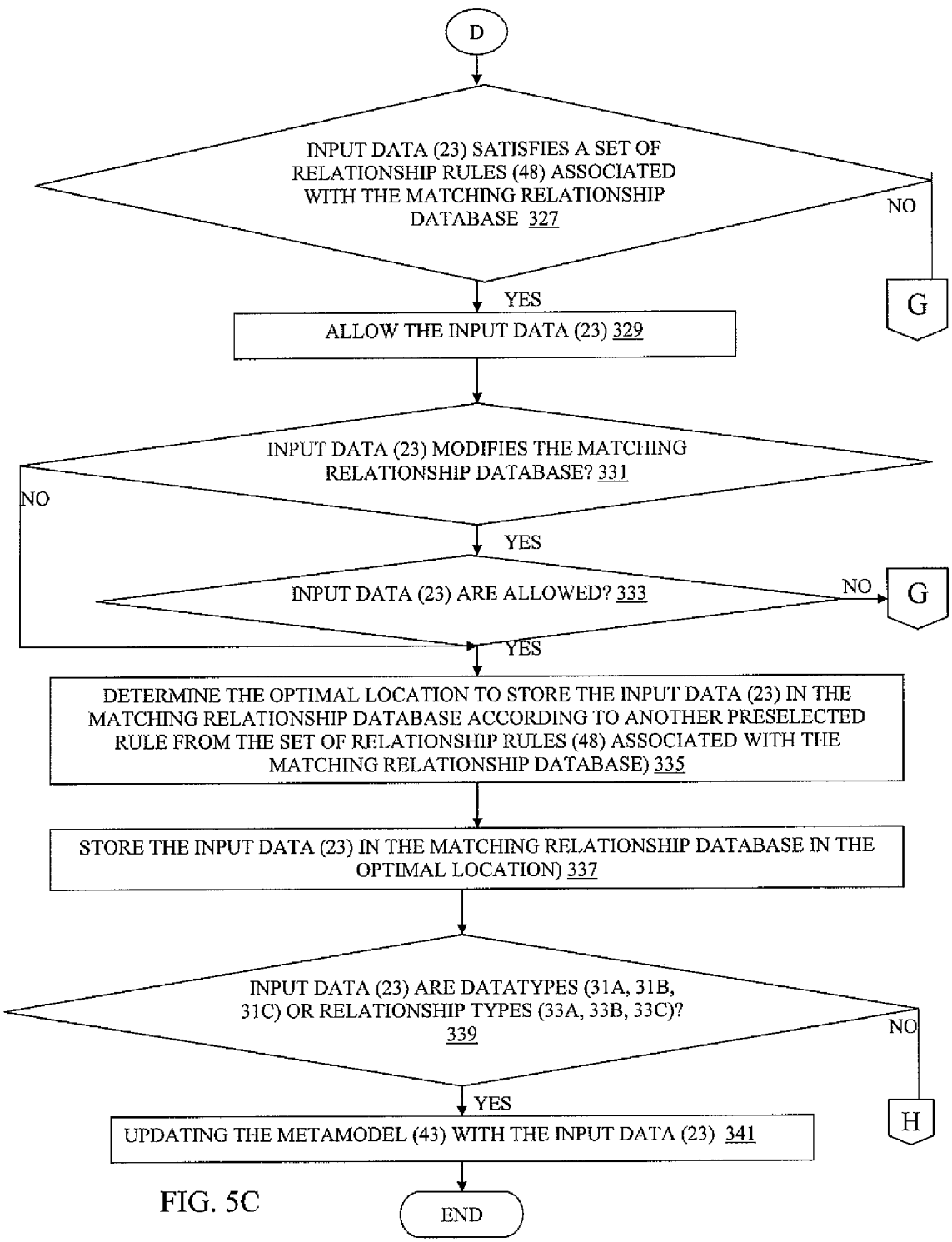

Continuing to refer to FIGS. 2, 4A, 4B, and 4C, if 307 (FIG. 5A) one of a set of data databases 31 (FIG. 2) does not match input data 23 (FIG. 2), method 300 (FIGS. 5A-5C) can continue processing at step 308 (FIG. 5A), i.e. allowing input data 23 (FIG. 2) temporarily, by sending temporary allowance notification 29 (FIG. 2), or refusing input data 23 (FIG. 2) by sending allow/refuse notification (FIG. 2), and resuming processing at step 301 (FIG. 5A). If 309 (FIG. 5A) input data 23 (FIG. 2) are not related to the retrieved context, method 300 (FIGS. 5A-5C) can continue processing at step 308 (FIG. 5A). If 311 (FIG. 5A) input data 23 (FIG. 2) does not satisfy data rules 47 (FIG. 2) associated with the matching data database, method 300 (FIGS. 5A-5C) can continue processing at step 308 (FIG. 5A). If 315 (FIG. 5B) input data 23 (FIG. 2) does not modify the matching data database, method 300 (FIGS. 5A-5C) can continue processing at step 319 (FIG. 5B). If 317 (FIG. 5B) input data 23 (FIG. 2) are not allowed and allow/refuse notification 27 (FIG. 2) is sent, method 300 (FIGS. 5A-5C) can continue processing at step 308 (FIG. 5A). If 323 (FIG. 5B) one of a set of relationship databases does not match input data 23 (FIG. 2), or if 325 (FIG. 5B) input data 23 (FIG. 2) is not related to retrieved context 25 (FIG. 2), method 300 (FIGS. 5A-5C) can continue processing at step 308 (FIG. 5A). If 327 (FIG. 4C) input data 23 (FIG. 2) does not satisfy relationship rules 48 (FIG. 2) associated with the matching relationship database, method 300 (FIGS. 5A-5C) can continue processing at step 308 (FIG. 5A). If 331 (FIG. 4C) input data 23 (FIG. 2) does not modify the matching relationship database, method 300 (FIGS. 5A-5C) can continue processing at step 335 (FIG. 4C). If 333 (FIG. 4C) input data 23 (FIG. 2) are not allowed, method 300 (FIGS. 5A-5C) can continue processing at step 308 (FIG. 5A). If 339 (FIG. 4C) input data 23 (FIG. 2) are not datatypes 31 or relationship types 33 (FIG. 2), method 300 (FIGS. 5A-5C) can continue processing at step 301 (FIG. 5A).

Referring again primarily to FIG. 2, method 300 (FIGS. 5A-5C) can optionally include the steps of creating metamodel 43 including the steps of (a) determining the datatypes 31A, 31B, 31C etc., (b) creating the relationship types 33A, 33B, 33C etc. by associating a selected predetermined set of the datatypes 31A, 31B, 31C etc. with each other, (c) creating metamodel 43 including the datatypes 31A, 31B, 31C etc. and the relationship types 33A, 33B, 33C etc., (d) associating attributes with the datatypes 31A, 31B, 31C etc. and the relationship types 33A, 33B, 33C etc., (e) prioritizing the attributes for each of the datatypes 31A, 31B, 31C etc. and each of the relationship types 33A, 33B, 33C etc., (f) providing the one of the set of the data databases 31 for each of the datatypes 31A, 31B, 31C etc., (g) providing the one of the set of relationship databases 33 for each of the relationship types 33A, 33B, 33C etc., (h) associating one of the sets of data rules 47 with each of the data databases 31 and one of the sets of relationship rules 48 with each of the relationship databases 33, and (j) storing the datatypes 31A, 31B, 31C etc., the relationship types 33A, 33B, 33C etc., at least one context 25, and the prioritized attributes in metamodel 43. Method 300 (FIGS. 5A-5C) can also optionally include the steps of, if input data 23 meet preselected temporary allowance conditions, temporarily allowing input data 23 and sending temporary allowance notification 29 (FIG. 2), and if input data 23 do not meet preselected temporary allowance conditions, refusing input data 23. Method 300 (FIGS. 5A-5C) can still further optionally include the steps of storing the allowed input data in, for example, B-trees, hashed structures, and "normal" trees, storing the allowed relationship data in, for example, B-trees, hashed structures, and "normal" trees, and storing the data rules 47 and the relationship rules 48 in request model 51 (FIG. 3). By using a tree browser, it is possible to focus on a particular element in the model without being flooded by the complexity of the entire model.

Figure 6:
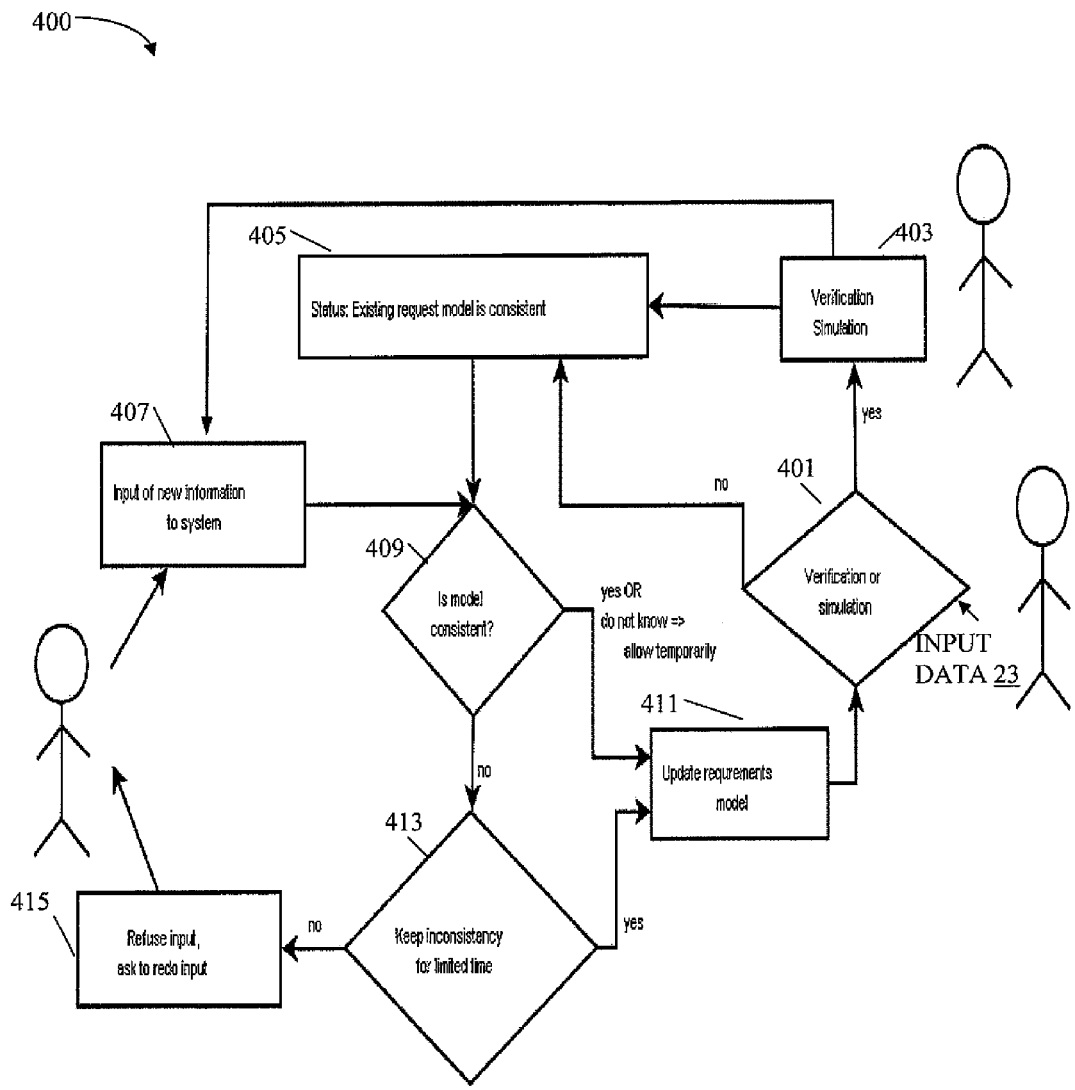
FIG. 6 is a flowchart of an embodiment of a method for processing input data during verification or simulation of a model.

Referring now primarily to FIG. 6, method 400 for checking context consistency can include, but is not limited to including, the steps of, if 401 a verification or simulation of request model 51 (FIG. 3) is required, method 400 can include the step of initiating 403 the verification or simulation until the model has reached a consistent status 405, or until more information has been provided 407 because the model was inconsistent. Method 400 can further include the step of, if 409 the model would be consistent with the addition of input data 23 (FIG. 2), updating 411 the model. If 409 the model could be either consistent or inconsistent with the addition of input data 23 (FIG. 2), method 400 can include the step of allowing input data 23 (FIG. 2) and updating 411 the model temporarily. If 409 input data 23 (FIG. 2) would make the model inconsistent, and if 413 the inconsistency can be maintained for a preselected amount of time, method 400 can include the step of updating 411 the model. If 409 input data 23 (FIG. 2) would make the model inconsistent, and if 413 the inconsistency cannot be maintained for a preselected amount of time, method 400 can include the step of refusing 415 input data 23 (FIG. 2).

Figure 7:
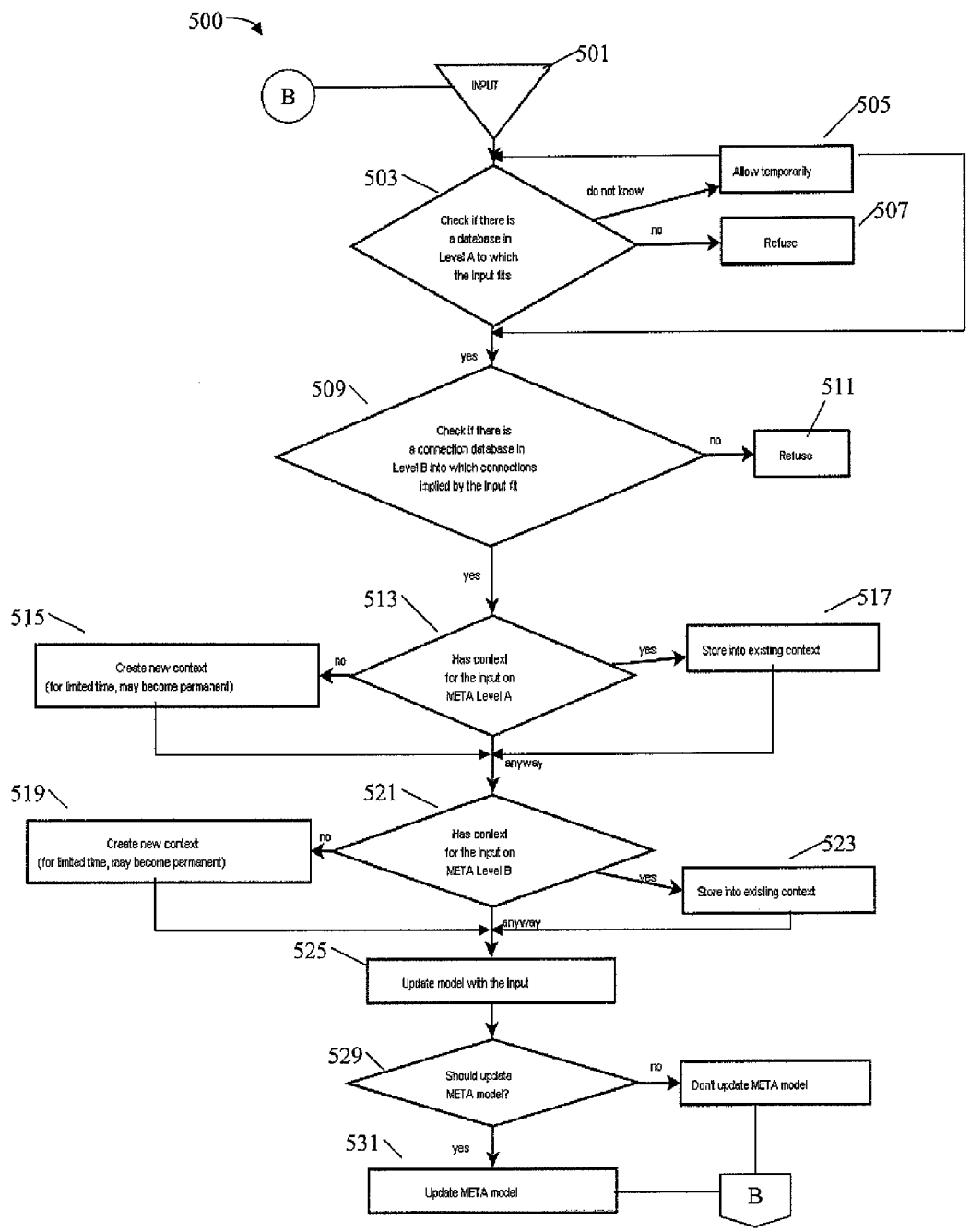
FIG. 7 is a flowchart of an embodiment of a method for model consistency checking.

Referring now primarily to FIGS. 6 and 7, method 500 (FIG. 7), an example of a method for consistency and context checking, can include, but is not limited to including, the steps of receiving 501 (FIG. 7) input data 23 (FIG. 2), and, if 503 (FIG. 7) there is one of data databases 31 (FIG. 2) in Level A 570 (FIG. 8A) into which input data 23 (FIG. 2) fits, and if 509 (FIG. 7) there is one of relationship databases 33 (FIG. 2) in Level B 572 (FIGS. 8A and 8B) into which relationships implied by input data 23 (FIG. 2) fit, and if 513 (FIG. 7) there is context 25 (FIG. 2) for input data 23 (FIG. 2) in Level A 570 (FIG. 8A), and if 521 (FIG. 6) there is context 25 (FIG. 2) for input data 23 (FIG. 2) in Level B 572 (FIGS. 8A and 8B), method 500 (FIG. 7) can include the step of updating 525 (FIG. 7) request model 51 with input data 23 (FIG. 2). If 503 (FIG. 7) there is no data database 31 (FIG. 2) in Level A 570 (FIG. 8A) into which input data 23 (FIG. 2) fits, method 500 (FIG. 7) can include the step of refusing 507 (FIG. 7) input data 23 (FIG. 2). If 503 (FIG. 7) it cannot be determined if there is a database in Level A 570 (FIG. 8A) into which input data 23 (FIG. 2) fits, method 500 (FIG. 7) can include the step of allowing 505 (FIG. 7) input data 23 (FIG. 2) temporarily for a preselected amount of time or through a preselected set of steps. For example, if input data 23 (FIG. 2) includes a new function, method 500 (FIG. 7) could include the step of processing the function because function database 31A (FIG. 2) is a database into which the new function fits. On the other hand, if input data 23 (FIG. 2) are incomplete, method 500 (FIG. 7) could include the step of refusing 507 (FIG. 7) the data, forcing the input entity, for example a user or a computer, to reprovide input data 23 (FIG. 2) in a format understood by the system. Finally, if input data 23 (FIG. 2) include a new function of the same name as an existing function, then there is data database 31 (FIG. 2) into which input data 23 (FIG. 2) fits, but there could be a consistency problem with two functions of the same name. In this case, method 500 (FIG. 7) could include the step of temporarily allowing 505 (FIG. 26) input data 23 (FIG. 2) until the inconsistency can be resolved through other actions taken by, for example, the user, the system, or another input entity. Note that the use of the attribute "name" is for exemplary purposes only. The process described above for processing, temporarily allowing, or refusing input data 23 (FIG. 2) can be applied to any type of data, and any attribute of the data, the uniqueness of attributes being determined by the rules stored within metamodel 43. If 509 (FIG. 7) there is not one of relationship databases 33 (FIG. 2) into which input data 23 (FIG. 2) could fit, method 500 (FIG. 7) can include the step of refusing 511 (FIG. 7) input data 23 (FIG. 2). For example, input data 23 (FIG. 2) for which there is not one of relationship databases 33 (FIG. 2) could be considered by method 500 (FIG. 7) to be a nonsense connection. On the other hand, input data 23 (FIG. 2) that implies a connection included in one of relationship databases 33 (FIG. 2) could be allowed. In the case in which input data 23 (FIG. 2) implies a duplicate connection (which decision is defined by metamodel rules), method 500 (FIG. 7) can include the step of refusing 511 (FIG. 7) input data 23 (FIG. 2). If 513 (FIG. 7) there is no context 25 (FIG. 2) for input data 23 (FIG. 2) on Level A 570 (FIG. 8A), method 500 (FIG. 7) can include the step of creating 515 (FIG. 7) a new context. Context 25 (FIG. 2) can be created for a limited time, depending on metamodel rules. If 513 (FIG. 7) context 25 (FIG. 2) exists at Level A 570 (FIG. 8A) for input data 23 (FIG. 2), method 500 (FIG. 7) can include the step of storing input data 23 (FIG. 2) into existing context 25 (FIG. 2). Context 25 (FIG. 2) can be associated with data, relationship, or metamodel objects. If 521 (FIG. 7) context 25 (FIG. 2) exists at Level B 572 (FIGS. 8A and 8B), method 500 (FIG. 7) can include the step of creating 519 (FIG. 7) a new context. Context 25 (FIG. 2) can be created for a limited time, depending on metamodel 43 (FIG. 2). If 513 (FIG. 7) context 25 (FIG. 2) exists at Level B 572 (FIG. 8A) for input data 23 (FIG. 2), method 500 (FIG. 7) can include the step of storing input data 23 (FIG. 2) into existing context 25 (FIG. 2). At either Level A 570 (FIG. 8A) or Level B 572 (FIGS. 8A and 8B), to determine if context 25 (FIG. 2) exists, for example, context 25 (FIG. 2) can be suggested as input data 23 (FIG. 2) are entered. Suggestions can be provided based on prioritized criteria such as, for example, temporal proximity, relationships, similarity search, incremental search, and/or artificial intelligence results. Temporal proximity can be used, for example, when it is known that the input entity does not change contexts 25 (FIG. 2) very often. Relationships can be guessed by knowing existing relationships in the model for which input data 23 (FIG. 2) are being entered. Similar words can be located and provided from a Thesaurus. An incremental search can progressively find a match for input data 23 (FIG. 2) by treating input data 23 (FIG. 2) as a search string that can narrow the search as each character is typed. If 529 (FIG. 7) it is determined by the nature of input data 23 (FIG. 2) that metamodel 43 (FIG. 2) should be updated, method 500 (FIG. 7) can include the step of updating 531 (FIG. 7) metamodel 43 (FIG. 2). Method 500 (FIG. 7) can continue receiving 501 (FIG. 7) input data 23 (FIG. 2).

Referring to FIGS. 1, 2, 3A, 3B, 4A-4C, 5, and 6, methods 200 (FIGS. 4A, 4B), 300 (FIGS. 5A-5C), 400 (FIG. 6), and 500 (FIG. 7) can be, in whole or in part, implemented electronically. Signals representing actions taken by elements of system 100 (FIG. 1) can travel over electronic communications media and from node to node in a communications network 26. Control and data information can be electronically executed and stored on computer-readable media. Methods 200 (FIGS. 4A, 4B), 300 (FIGS. 5A-5C), 400 (FIG. 6), and 500 (FIG. 7) can be implemented to execute on a node in a computer communications network 26. Common forms of computer-usable media include, for example, a floppy disk, a flexible disk, hard disk, magnetic tape, or any other magnetic medium, a CDROM, any other optical medium, punched cards, paper tape, any other physical medium with patterns of holes, a RAM, a PROM, and EPROM, a FLASH-EPROM, any other memory chip or cartridge, or any other medium from which a computer can read. From a technological standpoint, a signal or carrier wave (such as used for Internet distribution of software) encoded with functional descriptive material is similar to a computer-readable medium encoded with functional descriptive material, in that they both create a functional interrelationship with a computer. In other words, a computer is able to execute the encoded functions, regardless of whether the format is a disk or a signal. System 100 (FIG. 1) can include communications network 26 that can include at least one node for carrying out methods 200 (FIGS. 4A, 4B), 300 (FIGS. 5A-5C), 400 (FIG. 6), and 500 (FIG. 7). System 100 (FIG. 1) can be a distributed network (such as a network utilizing a distributed system format such as, but not limited to, DCOM or CORBA) where computer data signal (such as, but not limited to, signals over the Internet) traveling over communications network 26 carrying information capable of causing a computer system in communications network 26 to practice methods 200 (FIGS. 4A, 4B), 300 (FIGS. 5A-5C), 400 (FIG. 6), and 500 (FIG. 7). Communications network 26 is a conventional network, for example, but not limited to, the networks described in Jacobs, I. M.; Binder, R.; Hoversten, E. V., *General purpose packet satellite networks*, Proc. IEEE, Vol. 66, No. 11, 1978, Page(s): 1448-1467 and in Kahn, R. E.; Gronemeyer, S. A.; Burchfiel, J.; Kunzelman, R. C., *Advances in packet ratio technology*, Proc. IEEE, Vol. 66, No. 11, 1978, Page(s): 1468-1496 and in similar subsequently developed networks; the signal is modulated and supplemental data is embedded utilizing conventional means, for example, but not limited to, the systems described in G. R. Cooper, C. D. McGillem, *Modern Communications and Spread Spectrum*, ISBN 0-07-012951-7, Ch. 1, pp. 28-44. System 100 (FIG. 1) can include a computer readable medium 28 having instructions embodied therein for the practice of methods 200 (FIGS. 4A, 4B), 300 (FIGS. 5A-5C), 400 (FIG. 6), and 500 (FIG. 7).

Referring to FIGS. 1 and 2, operationally, system 100 (FIG. 1) can include the following capabilities that can be accomplished through method steps. For example, a method for defining an automated request model can include, but is not limited to including, the steps of receiving a request to create a function, receiving a proposed function name for the function; and establishing a current context based on the function and the proposed function name. If there is another function having a function name that matches the proposed function name, the method could include the steps of creating and storing the function temporarily. If the function name does not match the proposed function name, the method could include the steps of creating and storing the function in the function database 31A (FIG. 2); receiving a request to create a scenario; and receiving a proposed scenario name for the scenario. If the scenario is connected to the function and if there is another scenario that has a scenario name that matches the proposed scenario name in the current context, found by matching the proposed scenario name with names in scenario database 31B (FIG. 2), the method could include the steps of creating and storing the scenario temporarily. If the scenario is connected to the function and if there is not another scenario that has a scenario name that matches the proposed scenario name in the current context, the method could include the steps of creating and storing the scenario in a scenario database 31B (FIG. 2); receiving a request to create a business architecture diagram; receiving a diagram name for the business architecture diagram; updating business architecture diagram attributes associated with the business architecture diagram with the diagram name; and receiving a request to connect the function to the scenario through a derivation connection. If a database associated with function-to-scenario connections contains the derivation connection, and if there is not another scenario having a matching scenario name in the current context, the method could include the steps of storing the scenario in the scenario database 31B (FIG. 2); and receiving a request to create a new participant; receiving a participant name. If there is not another participant name that matches the participant name within the current context, the method could include the steps of updating attributes of the new participant with the participant name; receiving a start node and an end node associated with the new participant; storing the start node and the end node as attributes associated with the new participant; and receiving a request to create a relationship referred to as ParticipantInRole to connect the participant and the scenario. If there is not another ParticipantInRole connecting the participant and the scenario, the method could include the step of creating the ParticipantInRole. If there is another ParticipantInRole connecting the participant and the scenario, and if a role attribute associated with each of the another ParticipantInRole and the ParticipantInRole is not the same, the method could include the steps of creating the ParticipantInRole and storing the ParticipantInRole in the participant-scenario relationship database 33C (FIG. 2); receiving a request to insert the ParticipantInRole into the business diagram; creating a visual representation of the ParticipantInRole in the business diagram; receiving a start state to insert in the business diagram; and connecting the start state to the ParticipantInRole. If another start state is connected to the ParticipantInRole, and if the start state is connected to an activity or status connected to the ParticipantInRole, the method could include the step of connecting the start state to the ParticipantInRole. If another start state is connected to the ParticipantInRole, and if the start state is not connected to the activity or status connected to the ParticipantInRole, the method could include the step of temporarily connecting the start state to the ParticipantInRole. If another start state is not connected to the ParticipantInRole, the method could include the steps of connecting the start state to the ParticipantInRole; receiving a request to insert a new activity; connecting the new activity to the business diagram; and connecting the new activity to the ParticipantInRole; receiving a new activity name for the new activity. If the new activity name does not match an activity name in the current context, the method could include the step of storing the new activity name as an attribute of the new activity. If the new activity name matches an activity name in the current context, the method could include the steps of temporarily storing the new activity name as an attribute of the new activity; receiving a request to insert a new status; connecting the new status to the business diagram; connecting the new status to the ParticipantInRole; and receiving a new status name for the new activity. If the new status name does not match a status name in the current context, the method could include the step of storing the new status name as an attribute of the new status. If the new status name matches a status name in the current context, the method could include the steps of temporarily storing the new status name as an attribute of the new status; and receiving a request to connect the new activity with the new status. If the new activity and the new status are connected to the participant, the method could include the step of connecting the new activity with the new status by storing a relationship referred to as TransitionEnd in an associated database. If the new activity and the new status are not connected to the participant, the method could include the steps of temporarily connecting the new activity with the new status; receiving a request to connect the start state with the new activity by a relationship referred to as TransitionStart. If there are no duplicate connections between the start state and the new activity, the method could include the steps of storing the TransitionStart relationship in the associated database; receiving a request to enter a new end state; receiving a request to connect the end state with a new TransitionEnd relationship. If the new TransitionEnd relationship is between the status and the end state or between the activity and the status, the method could include the step of storing the TransitionEnd relationship in an associated database.

An exemplary implementation of consistency checking can be described as follows. In this implementation, all data are designed according to a uniform structure. The elements of the models are termed "nodes", and the links between them are termed "connections". Each node and connection can have different attributes. Nodes are, for example, classes of objects, and connections are, for example, the aggregation or association of relationships. Stated differently, nodes can be activities of objects, and connections can be communications between the activities. In this implementation, when generating models, the rules of concrete nodes and connections are adhered to which allow the modeling of only such data as are permissible for the relevant type of node and connection. Any inconsistency and incorrectness of models can be shown in a display which shows shortcomings found in a hierarchical form. For each error detected, textual advice can be displayed stating how to correct it. In this implementation, elements (nodes, connections) in the database of the project can have an automatically allocated unique name designated as the "System name", which can consist of the type of the object and its serial number in the database. Thus, it is possible to have, for example, in one model two different objects with the same name. Each object in the model may be displayed more than once, where different displays of the same element are called "presentors". Presentors can be merged, and a separate object can be created from several presentors. The connections associated with the original objects can be automatically reconnected to the new object.

Although the disclosure has been described with respect to various embodiments, it should be realized this disclosure is also capable of a wide variety of further and other embodiments.

What is claimed is:

1. A method for consistency checking of a request model and a metamodel comprising the steps of:
   receiving input data;
   if a context is not already created, creating the context, storing the input data in the context, and storing the context in a context database;
   if the context database is created, and the context is not already retrieved, retrieving at least one of the contexts from the context database according to the input data;

if one of a set of data databases matches the input data, if the input data are related to the retrieved context, and if the input data satisfy a set of data rules associated with the matching data database, allowing the input data; said set of data rules associated with the matching data database being obtained from the metamodel;

if the input data modify the matching data database, and if the input data are allowed, determining an optimal location to store the input data in the matching data database according to a preselected rule from the set of data rules associated with the matching data database, and storing the input data in the matching data database in the optimal location, thereby updating the request model;

if one of a set of relationship databases matches the input data, if the input data is related to the retrieved context, and if the input data satisfies a set of relationship rules associated with the matching relationship database, allowing the input data;

if the input data modify the matching relationship database, and if the input data are allowed, determining the optimal location to store the input data in the matching relationship database according to another preselected rule from the set of relationship rules associated with the matching relationship database, and storing the input data in the matching relationship database in the optimal location, thereby updating the request model; said set of relationship rules associated with the matching relationship database being obtained from the metamodel;

if the input data are datatypes or relationship types, updating the metamodel with the input data;

verifying and validating, using a simulator, said request model by navigating said request model according to information generated by said simulator, or according to said input data, or according to said request model; and monitoring, using an abstractor, said data databases and said relationship databases to detect patterns that can be transformed, to propose possible transformations, and to transform said patterns in said data databases and said relationship databases according to said metamodel.

2. The method as in claim 1 further comprising the step of:
creating the metamodel including the steps of:
determining the datatypes;
creating the relationship types by associating a selected predetermined set of the datatypes with each other;
creating the metamodel including the datatypes and the relationship types;
associating attributes with the datatypes and the relationship types;
prioritizing the attributes for each of the datatypes and each of the relationship types;
providing the one of the set of the data databases for each of the datatypes;
providing the one of the set of relationship databases for each of the relationship types;
associating one of the sets of data rules with each of the data databases and one of the sets of relationship rules with each of the relationship databases; and
storing the datatypes, the relationship types, the at least one context, and the prioritized attributes in the metamodel.

3. The method as in claim 1 further comprising the step of:
if the input data meet preselected temporary allowance conditions, temporarily allowing the input data; and
if the input data do not meet preselected temporary allowance conditions, refusing the input data.

4. The method as in claim 1 further comprising the steps of:
storing the allowed input data in a structure;
storing the allowed relationship data in the structure; and
storing the data rules and the relationship rules in the request model.

5. A system for consistency checking of a request model and a metamodel comprising:
an input manager sorting input data into categories including data, relationship data, and metamodel data;
a context manager checking a context for said input data, creating said context if necessary, and storing said input data in said context;
a data database manager matching, if said input data are said data, said input data with a data database, consistency checking said input data against data rules associated with said data database to determine if said input data that matches said data database are acceptable; modifying said data database by storing said input data in said data database, thereby updating said request model, if said input data are acceptable; said data rules associated with said data database being obtained from the metamodel;
a relationship database manager matching, if said input data are said relationship data, said input data with a relationship database, consistency checking said input data against relationship rules associated with said relationship database to determine if said input data that matches said relationship database are acceptable, modifying said relationship database by storing said input data in said relationship database, thereby updating said request model, if said input data are acceptable; said relationship rules associated with said relationship database being obtained from the metamodel; and
a metamodel manager creating said metamodel and updating said metamodel with said input data if said input data are said metamodel data;
wherein said input manager routes said input data to one of said context manager, said data database manager, said relationship database manager, or said metamodel manager, depending upon said input data;
a simulator verifying and validating said request model by navigating said request model according to information generated by said simulator, or according to said input data, or according to said request model; and
an abstractor monitoring said data databases and said relationship databases to detect patterns that can be transformed, to propose possible transformations, and to transform said patterns in said data databases and said relationship databases according to said metamodel.

6. The system of claim 5 further comprising:
a data receiver receiving said input data.

7. The system of claim 5 further comprising:
a validator interfacing with said data database manager and said relationship database manager, and validating said request model.

8. The system of claim 5 wherein said data database manager stores said input data in an optimal location according to a preselected rule from said set of data rules.

9. The system of claim 5 wherein said relationship database stores said input data in an optimal location according to a preselected rule from said set of relationship rules.

* * * * *